United States Patent
Okano et al.

(10) Patent No.: US 11,096,318 B2
(45) Date of Patent: Aug. 17, 2021

(54) FERRITE LAMINATE AND NOISE SUPPRESSION SHEET

(71) Applicant: TODA KOGYO CORP., Hiroshima (JP)

(72) Inventors: Yoji Okano, Otake (JP); Akihiro Yoshida, Otake (JP); Kazumi Yamamoto, Otake (JP); Yuji Omote, Tokyo (JP)

(73) Assignee: TODA KOGYO CORP., Hiroshima (JP)

( * ) Notice: Subject to any disclaimer, the term of this patent is extended or adjusted under 35 U.S.C. 154(b) by 0 days.

(21) Appl. No.: 15/743,794

(22) PCT Filed: Jul. 11, 2016

(86) PCT No.: PCT/JP2016/070393
§ 371 (c)(1),
(2) Date: Jan. 11, 2018

(87) PCT Pub. No.: WO2017/010447
PCT Pub. Date: Jan. 19, 2017

(65) Prior Publication Data
US 2018/0199474 A1 Jul. 12, 2018

(30) Foreign Application Priority Data
Jul. 14, 2015 (JP) .............................. JP2015-140871

(51) Int. Cl.
| | | |
|---|---|---|
| H05K 9/00 | (2006.01) | |
| B32B 7/02 | (2019.01) | |
| H01F 1/36 | (2006.01) | |
| H01F 1/34 | (2006.01) | |

(52) U.S. Cl.
CPC ............. *H05K 9/0088* (2013.01); *B32B 7/02* (2013.01); *H01F 1/36* (2013.01); *B32B 2307/212* (2013.01); *H01F 1/344* (2013.01)

(58) Field of Classification Search
CPC ... H05K 9/0088; H05K 9/0081; H05K 9/0073
USPC ...................................................... 428/323
See application file for complete search history.

(56) References Cited

U.S. PATENT DOCUMENTS

| | | | | |
|---|---|---|---|---|
| 6,136,228 A | * | 10/2000 | Hirai ........................ | H01B 1/22 252/512 |
| 2012/0237728 A1 | * | 9/2012 | Kimura .................. | C04B 35/265 428/141 |
| 2014/0141220 A1 | * | 5/2014 | Yamamoto .......... | H05K 9/0088 428/215 |

FOREIGN PATENT DOCUMENTS

| | | |
|---|---|---|
| JP | 7-212079 | 8/1995 |
| JP | 10-224079 | 8/1998 |
| JP | 2000-156592 | 6/2000 |
| JP | 2000-296431 | 10/2000 |
| JP | 2005-213115 | 8/2005 |
| JP | 2008-296431 | 12/2008 |
| JP | 2009-290075 | 12/2009 |
| JP | 2010-114246 | 5/2010 |
| JP | 2013-229541 | 11/2013 |
| JP | 2015-117174 | 6/2015 |
| WO | WO 2014/088954 | 6/2014 |

OTHER PUBLICATIONS

Machine translation of JP 2008296431 A, to Kimura et al. published Dec. 11, 2008 (Year: 2008).*
International Search Report for PCT/JP2016/070393, dated Sep. 13, 2016, 4 pages.
International Preliminary Report on Patentability issued in PCT/JP2016/070393 dated Jan. 16, 2018.
Office Action issued in JP Appln. No. 2017-528666 dated Jun. 9, 2020 (translation only).
Flexible Ferrite Sheet, Toda Kogyo Corp. (Oct. 8, 2019).

* cited by examiner

*Primary Examiner* — Jane L Stanley
(74) *Attorney, Agent, or Firm* — Nixon & Vanderhye P.C.

(57) ABSTRACT

In accordance with the present invention, there is provided a noise suppression sheet that is capable of absorbing noise at a wide frequency range of from 10 MHz to 1 GHz. The present invention relates to a ferrite laminate formed by laminating a conductive layer comprising a conductive filler and a resin and a magnetic layer comprising ferrite; the conductive layer has a surface electrical resistance of of 100 to 5000 $\Omega/\square$; the ferrite is partitioned into small parts; and a real part of a magnetic permeability of the ferrite as measured at 10 MHz is 130 to 480, and an imaginary part of of the magnetic permeability of the ferrite as measured at 10 MHz is 30 to 440.

6 Claims, No Drawings

FERRITE LAMINATE AND NOISE SUPPRESSION SHEET

This application is the U.S. national phase of International Application No. PCT/JP2016/070393 filed 11 Jul. 2016, which designated the U.S. and claims priority to JP Patent Application No. 2015-140871 filed 14 Jul. 2015, the entire contents of each of which are hereby incorporated by reference.

TECHNICAL FIELD

The present invention relates to a ferrite laminate comprising a conductive layer that comprises a conductive filler and a resin and a magnetic layer that comprises sintered ferrite, and a noise suppression sheet comprising the ferrite laminate.

BACKGROUND ART

In recent years, the progress of digital electronic devices has become noticeable. In particular, in mobile electronic devices such as typically smart phones, cellular phones, digital cameras and clamshell type computers, in order to operate these electronic devices by high-frequency actuating signals and reduce the size and weight of the electronic devices, the most important technical problem to be solved resides in high-density packaging of electronic parts or wiring circuit boards within the electronic devices.

With the recent progress of high-density packaging of electronic parts or printed circuit board within the electronic devices as well as use of high-frequency actuating signals for operating the electronic devices, there is such a tendency that unnecessary radiation generated from the electronic devices gives an adverse influence on surrounding electronic parts or members. For this reason, for the purpose of suppressing unnecessary radiation emitted from a microprocessor, LSI or a liquid crystal panel of the electronic devices, etc., a noise suppression sheet has been attached onto electronic circuits or printed circuit board, etc.

CITATION LIST

Patent Literatures

Patent Literature 1: Japanese Patent Application Laid-Open (KOKAI) No. 7-212079
Patent Literature 2: Japanese Patent Application Laid-Open (KOKAI) No. 2009-290075
Patent Literature 3: Japanese Patent Application Laid-Open (KOKAI) No. 2013-229541

SUMMARY OF INVENTION

Technical Problem

In Patent Literature 1, there is described a noise suppression sheet that comprises, as soft magnetic particles, flat Fe—Al—Si alloy particles having an average particle diameter of 10 μm. In Patent Literature 1, it is also described that the noise suppression sheet has a good noise suppressing effect at a frequency of several hundreds of MHz to several GHz.

In Patent Literature 2, there is described a noise suppression sheet comprising an Ni—Zn ferrite sintered ceramics. In Patent Literature 2, it is also described that the noise suppression sheet provided therein is capable of reducing reflection of electromagnetic waves thereon at a frequency of from 10 MHz to 1 GHz by controlling a complex magnetic permeability and a volume resistivity of the Ni—Zn ferrite. However, the amount of electromagnetic waves absorbed by the noise suppression sheet as measured at 10 MHz is as small as several %.

In Patent Literature 3, there is described a noise suppression sheet formed by laminating a conductive layer comprising a conductive filler and a resin and a magnetic layer comprising soft magnetic particles and a resin. In Patent Literature 3, it is also described that the noise suppression sheet has a good noise suppressing effect at a frequency of several hundreds of MHz to several GHz.

As described above, various noise suppression sheets capable of exhibiting a good noise suppressing effect at a frequency of several hundreds of MHz to several GHz have been conventionally proposed. However, any noise suppression sheets capable of exhibiting a sufficient noise suppressing effect even when used in electronic devices or parts from which noise is generated at a frequency of several tens of MHz have not been conventionally proposed yet.

Under these circumstances, an object or technical task of the present invention is to provide a ferrite laminate and a noise suppression sheet which are capable of exhibiting a sufficient noise suppressing effect even at a frequency of 10 MHz and 1 GHz.

Solution to Problem

The above object or technical task of the present invention can be achieved by the following aspects of the present invention.

That is, according to the present invention, there is provided a ferrite laminate comprising:
a conductive layer comprising a conductive filler and a resin, and
a magnetic layer comprising a sintered ferrite (Invention 1).

Also, according to the present invention, there is provided the ferrite laminate described in the above Invention 1, wherein when subjecting the ferrite laminate to measurement of transmission attenuation using a microstripline, an amount of transmission attenuation of the ferrite laminate is 3.6 to 8 dB as measured at 1 GHz, and when subjecting the ferrite laminate to measurement of transmission attenuation using a loop antenna, an amount of transmission attenuation of the ferrite laminate is 12 to 30 dB as measured at 10 MHz (Invention 2).

Also, according to the present invention, there is provided the ferrite laminate described in the above Invention 1 or 2, wherein a real part of a magnetic permeability of the magnetic layer as measured at 10 MHz is 130 to 480, and an imaginary part of the magnetic permeability of the magnetic layer as measured at 10 MHz is 30 to 440 (Invention 3).

Also, according to the present invention, there is provided the ferrite laminate described in any one of the above Inventions 1 to 3, wherein the conductive layer has a surface electrical resistance of 100 to 5000Ω/□ (Invention 4).

Also, according to the present invention, there is provided the ferrite laminate described in any one of the above Inventions 1 to 4, wherein the conductive layer and the magnetic layer are laminated through an adhesive layer (Invention 5).

Also, according to the present invention, there is provided the ferrite laminate described in any one of the above Inventions 1 to 5, wherein the ferrite laminate further comprises the adhesive layer or a protective layer on at least one surface thereof (Invention 6).

Also, according to the present invention, there is provided the ferrite laminate described in any one of the above Inventions 1 to 6, wherein the ferrite laminate further comprises the adhesive layer on one surface thereof, and the ferrite laminate further comprises the protective layer on the other surface thereof (Invention 7).

Also, according to the present invention, there is provided the ferrite laminate described in any one of the above Inventions 1 to 7, wherein the sintered ferrite has a composition comprising 47 to 50 mol % of $Fe_2O_3$, 8 to 16 mol % of NiO, 24 to 35 mol % of ZnO and 7 to 12.5 mol % of CuO, as calculated in terms of the respective oxides, with the proviso that a total molar amount of these oxides is 100 mol % (Invention 8).

In addition, according to the present invention, there is provided a noise suppression sheet comprising the ferrite laminate described in any one of the above Inventions 1 to 8 (Invention 9).

Advantageous Effects of Invention

The ferrite laminate according to the present invention is capable of absorbing noise not only at a frequency of 1 GHz in a high-frequency band, but also at a frequency of 10 MHz in a low-frequency band, and therefore can be suitably used as a noise suppression sheet for mobile electronic devices, etc.

DESCRIPTION OF EMBODIMENTS

The construction of the present invention is described in more detail below.

The ferrite laminate according to the present invention is formed by laminating a conductive layer that comprises a conductive filler and a resin and a magnetic layer that comprises sintered ferrite. The conductive layer and/or the magnetic layer may be respectively constituted of a plurality of layers laminated on each other.

The sintered ferrite used in the present invention preferably has a composition comprising 47 to 50 mol % of $Fe_2O_3$, 8 to 16 mol % of NiO, 24 to 35 mol % of ZnO and 7 to 12.5 mol % of CuO, as calculated in terms of the respective oxides, with the proviso that a total molar amount of the above oxides is 100 mol %. However, the sintered ferrite may also comprise a very small amount of impurities that may be inevitably mixed in the sintered ferrite from raw materials of the sintered ferrite or during the production process thereof.

When the content of $Fe_2O_3$ in the ferrite used in the present invention is less than 47 mol %, the $\mu'$ value of the ferrite tends to be lowered. When the content of $Fe_2O_3$ in the ferrite used in the present invention is more than 50 mol %, it is not possible to sinter the ferrite composition. The content of $Fe_2O_3$ in the ferrite used in the present invention is more preferably 47.5 to 49.5 mol %.

When the content of NiO in the ferrite used in the present invention is less than 8 mol %, the $\mu''$ value of the ferrite tends to be increased. When the content of NiO in the ferrite used in the present invention is more than 16 mol %, the $\mu'$ value of the ferrite tends to be lowered. The content of NiO in the ferrite used in to the present invention is more preferably 8.5 to 15.5 mol %.

When the content of ZnO in the ferrite used in the present invention is less than 24 mol %, the $\mu'$ value of the ferrite tends to be lowered. When the content of ZnO in the ferrite used in to the present invention is more than 35 mol %, the $\mu''$ value of the ferrite tends to be increased. The content of ZnO in the ferrite used in the present invention is more preferably 24.5 to 34.5 mol %.

When the content of CuO in the ferrite used in the present invention is less than 7 mol %, it is not possible to sinter the ferrite composition. When the content of CuO in the ferrite used in the present invention is more than 12.5 mol %, the $\mu'$ value of the ferrite tends to be lowered. The content of CuO in the ferrite used in the present invention is more preferably 7.5 to 12.0 mol %.

The ferrite plate used in the present invention preferably has a density of 4.8 to 5.3 $g/cm^3$. When the density of the ferrite plate is less than 4.8 $g/cm^3$, the ferrite tends to suffer from fracture or breaking owing to insufficient sintering thereof, so that it may be difficult to handle the ferrite in the production process thereof. The density of the ferrite obtained in the present invention is 5.3 $g/cm^3$ in maximum.

The thickness of the ferrite used in the present invention is preferably 20 to 110 μm. The ferrite having a thickness of less than 20 μm may be difficult to industrially produce. When the thickness of the ferrite is more than 110 μm, the ferrite tends to fail to meet the requirement of reduction in thickness thereof, and further tends to suffer from increase in weight thereof and therefore also tends to fail to meet the requirement of reduction in weight thereof. The thickness of the ferrite used in the present invention is more preferably 25 to 105 μm.

The real part $\mu'$ of the magnetic permeability of the ferrite used in the present invention as measured at 10 MHz is preferably 130 to 480. When the real part $\mu'$ of the magnetic permeability of the ferrite as measured at 10 MHz is less than 130, the imaginary part $\mu''$ of the magnetic permeability of the ferrite as measured at 10 MHz tends to be lowered, so that the obtained ferrite laminate tends to be deteriorated in noise suppressing effect. In the present invention, it is not possible to obtain the ferrite having a magnetic permeability whose real part $\mu'$ exceeds 480. The real part $\mu'$ of the magnetic permeability of the ferrite as measured at 10 MHz is more preferably 150 to 460.

The imaginary part $\mu''$ of the magnetic permeability of the ferrite used in the present invention as measured at 10 MHz is preferably 30 to 440. When the imaginary part $\mu''$ of the magnetic permeability of the ferrite as measured at 10 MHz is less than 30, the obtained ferrite laminate tends to be deteriorated in noise suppressing effect. In the present invention, it is not possible to obtain the ferrite having a magnetic permeability whose imaginary part $\mu''$ exceeds 440. The imaginary part $\mu''$ of the magnetic permeability of the ferrite used in the present invention as measured at 10 MHz is more preferably 35 to 420.

The magnetic layer used in the present invention comprises the specific sintered ferrite as described above, and does not comprise other components such as a resin. With such a composition of the magnetic layer, unlike those described in Patent Literatures 1 and 3, the ferrite laminate produced according to the present invention is capable of exhibiting a sufficient noise suppressing effect as measured even at 10 MHz and 1 GHz.

The conduct layer used in the present invention is obtained by dispersing a conductive filler in a resin and then forming the resulting dispersion into a sheet shape. As the conductive filler, there may be used a conductive carbon. Example of the preferred conductive carbon include a conductive carbon black, a fibrous carbon formed by processing carbon fibers, and a carbon nanotube. The conductive carbon black is preferably a carbon black having a particle diameter of 20 to 60 nm and a BET specific surface area of 30 to 1300 $m^2/g$, and more preferably a highly-conductive carbon black of a hollow structure having a particle diameter of 30 to 40 nm and a BET specific surface area of 700 to 1300 $m^2/g$. The fibrous carbon formed by processing carbon fibers is preferably in the form of a milled fiber having a fiber length of 30 to 150 μm or a cut fiber having a fiber length of 3 to 24 mm. The carbon nanotube is preferably such a carbon nanotube having a fiber diameter of 40 to 160 μm, a BET specific surface area of 16 to 34 $m^2/g$ and a purity of not less than 99%.

The conductive layer used in the present invention preferably comprises the conductive filler in an amount of 5 to 25% by weight. When the content of the conductive filler in the conductive layer is less than 5% by weight, the obtained ferrite laminate tends to have an enhanced surface electrical resistance and therefore tends to fail to exhibit a desired noise suppressing effect. When the content of the conductive filler in the conductive layer is more than 25% by weight, the amount of reflection of electromagnetic waves on the ferrite laminate upon the measurement using a microstripline tends to be increased, so that it may be difficult to transmit signals through the resulting device. The content of the conductive filler in the conductive layer is more preferably 7 to 24% by weight.

The conductive layer used in the present invention preferably comprises the resin in an amount of 10 to 30% by weight. When the content of the resin in the conductive layer is less than 10% by weight, the conductive layer tends to hardly maintain its sheet shape. When the content of the resin in the conductive layer is more than 30% by weight, it may be difficult to obtain the ferrite laminate capable of exhibiting a desired noise suppressing effect.

As the resin to be included in the conductive layer used in the present invention, an acrylic resin or a phenol resin is preferably used. The acrylic resin and the phenol resin may also be used in the form of a mixture thereof. In the present invention, as the acrylic resin and the phenol resin, there may be used conventionally known acrylic resins and phenol resins.

The conductive layer used in the present invention may also comprise a flame retardant. As the flame retardant, there may be used conventionally known flame retardants. Examples of the flame retardant include aluminum hydroxide, magnesium hydroxide and the like. The content of the flame retardant in the conductive layer is preferably 0 to 30% by weight, and more preferably 13 to 26% by weight.

The conductive layer used in the present invention may also comprise particles having an average particle diameter of 0.05 to 5 μm as a dispersing agent for the conductive filler. In particular, in the case where the conductive filler is in the form of fibers, the particles as the dispersing agent are capable of exhibiting a high effect of dispersing the conductive filler in the step of mixing the raw materials. The dispersing agent used in the present invention is not particularly limited. Examples of the dispersing agent include various kinds of oxide particles, e.g., iron oxide particles such as hematite particles and magnetite particles, ferrite particles, silicon oxide particles and aluminum oxide particles. Furthermore, as the dispersing agent, there may also be used metal particles. In the case where the conductive layer comprises magnetic particles such as magnetite particles or ferrite particles as the dispersing agent, the content of the dispersing agent in the conductive layer is preferably controlled such that the amount of transmission attenuation of the resulting ferrite laminate upon the measurement using a loop antenna is not adversely influenced thereby. The content of the dispersing agent in the conductive layer is preferably 30 to 70% by weight. When the content of the dispersing agent in the conductive layer is out of the aforementioned specific range, the dispersing agent tends to be deteriorated in its function.

The thickness of the conductive layer used in the present invention is preferably 15 to 90 μm. When the thickness of the conductive layer is less than 15 μm, the amount of transmission attenuation of the resulting ferrite laminate upon the measurement using a microstripline tends to be reduced, so that the ferrite laminate tends to fail to exhibit a desired noise suppressing effect. When the thickness of the conductive layer is more than 90 μm, the amount of reflection of electromagnetic waves on the ferrite laminate upon the measurement using a microstripline tends to be increased, so that it may be difficult to transmit signals through the resulting device. The thickness of the conductive layer used in the present invention is more preferably 20 to 85 μm.

The surface electrical resistance of the conductive layer used in the present invention is preferably 100 to 5000Ω/□. When the surface electrical resistance of the conductive layer is less than 100Ω/□, the amount of transmission attenuation of the resulting ferrite laminate upon the measurement using a microstripline tends to be reduced, so that the ferrite laminate tends to fail to exhibit a desired noise suppressing effect. When the surface electrical resistance of the conductive layer is more than 5000Ω/□, the amount of reflection of electromagnetic waves on the resulting ferrite laminate upon the measurement using a microstripline tends to be increased, so that it may be difficult to transmit signals through the resulting device. The surface electrical resistance of the conductive layer used in the present invention is more preferably 110 to 4900 Ω/□.

The amount of transmission attenuation of the ferrite laminate according to the present invention upon the measurement using a microstripline is preferably 3.6 to 8 dB as measured at 1 GHz. When the amount of transmission attenuation of the ferrite laminate upon the measurement using a microstripline as measured at 1 GHz is less than 3.6 dB, the ferrite laminate tends to fail to exhibit a desired noise suppressing effect. When the amount of transmission attenuation of the ferrite laminate upon the measurement using a microstripline as measured at 1 GHz is more than 8.0 dB, the amount of reflection of electromagnetic waves on the resulting ferrite laminate upon the measurement using a microstripline tends to be increased, so that it may be difficult to transmit signals through the resulting device. The amount of transmission attenuation of the ferrite laminate upon the measurement using a microstripline is more preferably 3.8 to 7.5 dB as measured at 1 GHz.

The amount of transmission attenuation of the ferrite laminate according to the present invention upon the measurement using a loop antenna is preferably 12 to 30 dB as measured at 10 MHz. When the amount of transmission attenuation of the ferrite laminate upon the measurement using a loop antenna as measured at 10 MHz is less than 12 dB, the ferrite laminate tends to fail to exhibit a desired noise suppressing effect. In the present invention, it is not possible to obtain the ferrite laminate having an amount of transmission attenuation of more than 30 dB as measured at 10 MHz. The amount of transmission attenuation of the ferrite laminate upon the measurement using a loop antenna is more preferably 13 to 29 dB as measured at 10 MHz.

The ratio of the thickness of the ferrite among the magnetic layer to the thickness of the conductive layer (ferrite/ conductive layer) which constitute the ferrite laminate according to the present invention is preferably 0.3 to 4.0.

The whole thickness of the ferrite laminate according to the present invention is preferably 35 to 200 µm.

The ferrite laminate according to the present invention may be formed by laminating the conductive layer and the magnetic layer through an adhesive layer.

The adhesive layer that may be used in the present invention may be constituted of a double-sided adhesive tape. The double-sided adhesive tape is not particularly limited, and any known double-sided adhesive tape using a PET film or a polyimide film as a base material or comprising no base material may be used in the present invention. In addition, the adhesive layer may be in the form of a laminated film obtained by laminating these films. The thickness of the adhesive layer is preferably 3 to 30 µm in order to meet the requirement of reduction in thickness of the resulting ferrite laminate.

The ferrite laminate according to the present invention may be provided on at least one surface thereof with the adhesive layer or a protective layer.

The protective layer used in the present invention which may be provided on the surface of the ferrite laminate is capable of enhancing reliability and durability against dusting caused upon partitioning the ferrite into small parts. The protective layer is not particularly limited as long as the protective layer is formed of a resin that can be stretched without breaking when bending or flexing the noise suppression sheet. Examples of the protective layer include a PET film, a polyimide film, a resin-containing paint and the like. In addition, the protective layer may be provided in the form of a laminated film obtained by sequentially laminating an adhesive and a bendable and stretchable film such as a PET film or a polyimide film on one surface of the ferrite. Furthermore, two or more protective layers may be provided on the surface of the ferrite. With such a structure, in the case where an upper one of the protective layers suffers from flaws, stains, breakage or the like upon the production steps and processing steps of the noise suppression sheet, the protective layers may be sequentially peeled off from the upper one thereof to thereby finally obtain the noise suppression sheet having a clean protective layer that is free of flaws, stains, breakage or the like as an uppermost protective layer. The thickness of the protective layer used in the present invention is preferably 3 to 30 µm in order to meet the requirement of reduction in thickness of the resulting ferrite laminate.

In the ferrite laminate according to the present invention, in order to closely attach the ferrite laminate to a bent portion and prevent the ferrite laminate from breaking upon use, the ferrite constituting the magnetic layer is preferably previously partitioned into small parts. As the method of partitioning the ferrite into small parts, there may be used, for example, any of the method in which the ferrite is partitioned into small parts along at least one groove that is previously formed on at least one surface of the ferrite and acts as a starting point for the partitioning, and the method in which the ferrite sintered plate is partitioned into small parts without forming any groove. The grooves may be formed either continuously or intermittently. In addition, a number of fine recesses formed on the ferrite may be substituted for the grooves. The shape of a section of the respective grooves is not particularly limited, and each groove may desirably have a U-shaped section or a V-shaped section.

The ferrite is preferably partitioned by the grooves into small parts each having an optional size which may be of a triangular shape, a quadrilateral shape, a polygonal shape or a combination of these shapes. For example, the length of one side of the triangular shape, quadrilateral shape or polygonal shape is usually 1 to 12 mm. When a member to which the ferrite laminate is to be attached, i.e., an adherend, has a curved surface, the length of one side of the triangular shape, quadrilateral shape or polygonal shape is preferably not less than 1 mm and not more than $\frac{1}{3}$ of a radius of curvature of the curved surface, and more preferably not less than 1 mm and not more than $\frac{1}{4}$ of a radius of curvature of the curved surface. Furthermore, the ferrite may be partitioned not only into the aforementioned regular shapes by the grooves, but also into any amorphous shapes by any other means.

The width of an upper opening portion of the respective grooves formed on the ferrite is usually preferably not more than 250 µm, and more preferably 1 to 150 µm. When the width of an upper opening portion of the respective grooves is more than 250 µm, the resulting noise suppression sheet tends to suffer from undesirably large deterioration in magnetic permeability. In addition, the depth of the respective grooves is preferably $\frac{1}{20}$ to $\frac{1}{4}$ and more preferably $\frac{1}{20}$ to $\frac{1}{6}$ of the thickness of the ferrite.

Next, the process for producing the ferrite laminate according to the present invention is described.

The ferrite laminate according to the present invention may be obtained by laminating the magnetic layer and the conductive layer which have been previously produced separately.

The magnetic layer constituted of the ferrite may be produced, for example, by the following method.

First, the ferrite particles may be produced by calcining a raw material mixture prepared by mixing raw materials such as oxides, carbonates, hydroxides, oxalates, etc., of the respective elements as constituents of the ferrite at predetermined compositional ratios, or calcining a precipitated product prepared by precipitating the respective elements in an aqueous solution thereof, in atmospheric air in a temperature range of 700 to 900° C. for 1 to 20 hr, and then pulverizing the resulting calcined product.

The resulting ferrite particles are mixed with a binder resin, and then the resulting mixture is molded into a ferrite-containing resin plate by a powder compression molding method, an injection molding method, a calendering method, an extrusion method, etc., and further the resulting ferrite-containing resin plate is subjected to sintering treatment, if required, after being subjected to degreasing treatment, whereby it is possible to obtain the aimed ferrite plate. Alternatively, the ferrite particles, a binder resin and a solvent are mixed with each other, and then the resulting mixture is applied onto a film or a sheet using a doctor blade, etc., to obtain a green sheet, and the resulting green sheet is subjected to sintering treatment, if required, after being subjected to degreasing treatment, whereby it is possible to obtain the aimed ferrite plate. Incidentally, a plurality of the green sheets obtained above may be laminated on each other, and then the resulting laminate may be subjected to sintering treatment.

In the case where the grooves are formed on the ferrite plate according to the requirements, formation of the grooves may be conducted during or after the molding step of forming the ferrite plate or after the sintering treatment. For example, when forming the ferrite plate by a powder compression molding method or an injection molding method, it is preferred that the grooves are formed during the molding step, whereas when forming the ferrite plate by a calendering method or an extrusion method, it is preferred that the grooves are formed after the molding step but before the sintering treatment. In the case where the ferrite plate is produced via the green sheet, it is preferred that the grooves are formed on the green sheet.

The degreasing treatment is usually carried out at a temperature of 150 to 500° C. The sintering temperature is usually 850 to 970° C., and preferably 870 to 960° C. The sintering time is usually 30 to 180 min, and preferably 30 to 120 min. When the sintering temperature is lower than 850° C., it may be difficult to sinter the particles, so that the resulting ferrite plate tends to be insufficient in strength, and the μ' value thereof tends to be lowered. In addition, since the sintering temperature of 970° C. is sufficient to allow sintering of the particles to well proceed, it is not necessary to raise the sintering temperature to higher than 970° C. When the sintering time is less than 30 min, it may be difficult to sinter the particles, so that the resulting ferrite plate tends to be insufficient in strength, and the μ' value thereof tends to be lowered. In addition, since the sintering time of 180 min is sufficient to allow the sintering of the particles to well proceed, it is not necessary to prolong the sintering time over 180 min.

Next, an adhesive layer is provided on one surface of the resulting ferrite plate, for example, by attaching a double-sided adhesive tape thereonto, and an adhesive layer and/or a protective layer are provided on the other surface of the ferrite plate. Then, the resulting laminate is subjected to partitioning treatment using a roller or the like to thereby obtain the magnetic layer formed by attaching the protective layer and/or the adhesive layer to the ferrite. The resulting magnetic layer is constituted of the sintered ferrite plate and has such a laminated structure that the adhesive layer or the protective layer is formed on at least one surface of the ferrite plate. Thus, the magnetic layer used in the present invention is different in its structure from a composite body in which a binder component such as a resin and the ferrite are present in a mixed state.

The conductive layer used in the present invention may be produced by any conventionally known methods. For example, the conductive filler, the resin and the like are added to a solvent, and the resulting mixture is stirred to obtain a dispersion. The thus obtained dispersion is applied onto a releasable film using a bar coater, a comma coater, a die coater, etc., to form a coating layer having an optional thickness on the film, and the resulting coated film is dried by heating, etc., to remove the solvent therefrom and thereby obtain the conductive layer.

Examples of the aforementioned solvent include ketone solvents such as methyl ethyl ketone, methyl isobutyl ketone, cyclohexanone and isophorone, ester solvents such as ethyl acetate and butyl acetate, aromatic solvents such as toluene and xylene, cellosolve solvents such as cellosolve acetate and methyl cellosolve acetate, ether solvents such as tetrahydrofuran and diethylene glycol dimethyl ether, alcohols such as isopropyl alcohol and n-butyl alcohol, and aprotic polar solvents such as dimethylformamide. The content of the solvent in the resin solution may be appropriately determined on the basis of the viscosity required for the solution, etc.

Examples of the releasable film include a polypropylene film, a fluororesin-based film, a polyethylene film, a polyethylene terephthalate (PET) film, paper, and a film obtained by subjecting the aforementioned film or paper to releasing treatment with a silicone resin, etc. The thickness of the releasable film is preferably 10 to 200 μm.

The aforementioned conductive layer is laminated on the magnetic layer consisted of the sintered ferrite plate which is produced by attaching the protective layer and the adhesive layer to the aforementioned ferrite, via the adhesive layer formed on one surface of the magnetic layer, whereby it is possible to obtain the ferrite laminate according to the present invention. Furthermore, the conductive layer may also be provided, on the other surface thereof opposite to the surface on which magnetic layer is laminated, with an adhesive layer or a protective layer, if required.

The ferrite laminate according to the present invention may be used as a noise suppression sheet. The noise suppression sheet may be attached to an object or adherend to exhibit a noise suppressing effect thereon.

The method of installing the noise suppression sheet according to the present invention onto the object or adherend is not particularly limited. However, the noise suppression sheet is preferably installed such that the magnetic layer is brought into contact with the surface for which it is required to suppress noise.

<Function>

The most important point of the present invention resides in that since the conductive layer of the noise suppression sheet according to the present invention has a surface electrical resistance that is controlled to an adequate range, the noise suppression sheet is capable of exhibiting a sufficient noise suppressing effect as measured at 1 GHz, and further since the μ" value of the ferrite as measured at 10 MHz is large, the noise suppression sheet is capable of exhibiting a sufficient noise suppressing effect as measured at 10 MHz.

EXAMPLES

Typical embodiments of the present invention are as follows.

The composition of the ferrite was measured using a fluorescent X-ray analyzer "3530" manufactured by Rigaku Corporation.

The thickness of the respective layers of the ferrite laminate or the noise suppression sheet according to the present invention was measured using a micrometer.

The density of the ferrite was calculated from an outer dimension of the ferrite measured using calipers and a micrometer and a weight of the ferrite measured by an electronic balance.

The real part μ' and the imaginary part μ" of the magnetic permeability of the ferrite constituting the magnetic layer were measured as follows. That is, after subjecting the ferrite provided thereon with an adhesive layer or a protective layer to partitioning treatment, a ring member formed by punching the ferrite into a ring shape having an outer diameter of 20 mm and an inner diameter of 10 mm was subjected to measurement of the magnetic permeability at a frequency of 10 MHz using an impedance analyzer "E4991A" manufactured by Agilent Technologies Japan, Ltd.

The surface electrical resistance of the conductive layer was measured using a resistivity meter "Loresta-GP" manufactured by Mitsubishi Chemical Corp. More specifically, a four pin probe "MCP-T600" was press-attached onto a central portion of the conductive layer formed into a size of a length of 35 mm and width of 45 mm to measure a surface electrical resistance thereof.

The amount of transmission attenuation upon the measurement using a microstripline was measured by the following method.

That is, a microstripline having a length of 75 mm, a width of 2.3 mm and a thickness of 35 μm whose impedance was controlled to 50Ω was provided on a substrate. The ferrite laminate formed into a shape of a length of 35 mm and a width of 45 mm was mounted to the substrate such that the length direction of the microstripline was aligned with the width direction of the laminate and centers of both the members were consistent with each other. Then, a foamed polystyrene plate being formed into a shape of a length of 35 mm, a width of 45 mm and a thickness of 10 mm and having an expansion ratio of about 25 times was superimposed on the laminate, and further a load of 560 g was placed on the foamed polystyrene plate to measure S parameters thereof using a network analyzer "N5230A" (manufactured by Agilent Technologies Japan, Ltd.) connected to the microstripline. The magnitude of $S_{21}$ (unit: dB) among the S parameters obtained above was determined as the amount of transmission attenuation of the ferrite laminate upon the measurement using a microstripline. Meanwhile, the large amount of transmission attenuation upon the measurement using a microstripline means that the effect of suppressing noise is high.

The amount of transmission attenuation upon the measurement using a loop antenna was measured by the following method.

That is, a pair of loop antennas each having a diameter of 4 mm were installed apart by 0.5 mm from each other such that loop surfaces of the loop antennas were parallel with each other and centers of the loop antennas were consistent with each other. Also, the ferrite laminate formed into a shape of a length of 35 mm and a width of 45 mm was disposed such that the center of the laminate was consistent with the center of the respective loop antennas. Using a network analyzer "N5230A" (manufactured by Agilent Technologies Japan, Ltd.) connected to the loop antennas, the magnitude of $S_{21}$ (unit: dB) when disposing the laminate was measured on the basis of the magnitude of $S_{21}$ when disposing no laminate, and was regarded as an amount of transmission attenuation of the ferrite laminate upon the measurement using a loop antenna. Meanwhile, the large amount of transmission attenuation upon the measurement using a loop antenna means that the effect of suppressing noise is high.

Example 1

The respective raw material oxides were weighed such that a ferrite material obtained therefrom had a predetermined composition, and wet-mixed with each other for 20 hr using a ball mill. Thereafter, the resulting mixed slurry was subjected to filtration and then drying to obtain mixed particles as a raw material. The thus obtained raw material mixed particles were calcined at 730° C. for 2 hr, and the resulting calcined product was pulverized using a ball mill, thereby obtaining Ni—Zn—Cu ferrite particles.

Eight parts by weight of polyvinyl butyral as a binder material, 3 parts by weight of benzyl-n-butyl phthalate as a plasticizer and 50 parts by weight of 3-methyl-3-methoxy-1-butanol as a solvent were added to 100 parts by weight of the thus obtained Ni—Zn—Cu ferrite particles, and then the resulting mixture was fully mixed with each other to obtain a slurry. The thus obtained slurry was applied onto a PET film using a doctor blade-type coater to form a coating film thereon. The coating film was then dried to obtain a green sheet having a thickness of 31 μm. Using a knife edge, grid-like grooves were formed on one surface of the green sheet.

The resulting green sheet was degreased at 400° C., and then sintered at 880° C. for 2 hr, thereby obtaining a ferrite plate. The thus obtained ferrite plate had a composition comprising 49.4 mol % of $Fe_2O_3$, 8.7 mol % of NiO, 34.3 mol % of ZnO and 7.6 mol % of CuO, a thickness of 26 μm and a density of 4.83 g/cm³. A PET film having a thickness of 10 μm was attached onto one surface of the resulting ferrite plate, and a double-sided tape having a thickness of 10 μm was attached onto the other surface of the ferrite plate. The resulting ferrite plate laminate was subjected to partitioning treatment using a roller to partition the ferrite into small parts to thereby obtain a laminate formed by attaching a protective layer and an adhesive layer to the ferrite (magnetic layer). The resulting ferrite had μ' of 170, μ" of 128 and a thickness of 46 μm.

Next, the conductive layer was produced by the following method. That is, 8% by weight of fibrous conductive carbon "GRANOC MILLED FIBER HC-600-15M" produced by Nippon Graphite Fiber Co., Ltd., 12% by weight of an acrylic resin "TEISANRESIN SG-P3" produced by Nagase ChemteX Corporation, 2% by weight of a phenol resin "CKM-908" produced by Showa Denko K.K., 14% by weight of aluminum hydroxide as a flame retardant and 64% by weight of granular magnetite "MAT-305" as a dispersing agent produced by Toda Kogyo Corporation were added to methyl ethyl ketone to prepare a conductive paint. The thus obtained conductive paint was applied to a PET film and heated and dried at 150° C. in a hot air circulation dryer to obtain a conductive layer. The thus obtained conductive layer had a thickness of 20 μm and a surface electrical resistance of 4860 Ω/□.

The release paper of the double-sided tape of the magnetic layer obtained above was released to expose the underlying adhesive layer outside, and the PET film of the conductive layer obtained above was released to laminate the conductive layer onto the adhesive layer, and then a 10 μm-thick adhesive layer (double-sided tape) was provided on the opposite surface of the conductive layer to thereby obtain a laminate. The thus obtained laminate had such a structure that the PET film, the ferrite plate, the adhesive layer, the conductive layer and the adhesive layer (double-sided tape) were successively laminated on each other in this order.

The resulting laminate had a thickness of 76 μm, and the ratio of the thickness of the magnetic layer to the thickness of the conductive layer (ferrite/conductive layer) was 1.3. In addition, the amount of transmission attenuation of the laminate upon the measurement using a microstripline was 3.8 dB as measured at 1 GHz, and the amount of transmission attenuation of the laminate upon the measurement using a loop antenna was 19.9 dB as measured at 10 MHz.

Examples 2 to 4

Respective laminates were produced by the same method as used in Example 1. The production conditions used in these Examples are shown in Table 1, and various properties of the thus obtained laminates are shown in Table 2.

Comparative Example 1

The same procedure as in Example 1 was conducted except that the composition of the ferrite and the sintering temperature were changed to thereby obtain a magnetic layer. The production conditions used in Comparative Example 1 are shown in Table 1, and various properties of the thus obtained magnetic single layer are shown in Table 2.

Comparative Example 2

A solution prepared by dissolving 20% by weight of a styrene-based elastomer in cyclohexanone and flat ironaluminum-silicon alloy particles (weight ratio of iron, aluminum and silicon: 85:6:9; aspect ratio: 20 to 30; average particle diameter: 40 μm) were weighed such that the alloy particles and the styrene-based elastomer were present in amounts of 55% by volume and 45% by volume, respectively, in terms of volume ratios thereof after removal of the solvent from the resulting mixture, and fully mixed with each other, thereby obtaining a slurry. At this time, ethyl cyclohexanone was added to the slurry to control a viscosity of the slurry. The resulting slurry was applied onto a PET film using a doctor blade-type coater, followed by drying the applied slurry to obtain a coating film. The thus obtained coating film was molded at a temperature of 130° C. under a pressure of 90 MPa for a pressing time of 5 min, thereby obtaining a sheet comprising the flat iron-aluminum-silicon alloy particles and having a thickness of 50 μm. The real part μ' and the imaginary part μ" of a magnetic permeability of the resulting sheet as measured at 10 MHz were 89 and 22, respectively, and the sheet had a surface electrical resistance of $2×10^8 \Omega/\square$. The amount of transmission attenuation of the obtained sheet upon the measurement using a microstripline was 1.2 dB as measured at 1 GHz, and the amount of transmission attenuation of the obtained sheet upon the measurement using a loop antenna was 10.8 dB as measured at 10 MHz.

The amounts of transmission attenuation of the resulting laminate are shown in Table 2.

Comparative Example 3

The conductive layer obtained in Example 1 and the sheet comprising the flat iron-aluminum-silicon alloy particles obtained in Comparative Example 2 were attached to each other through a 10 μm-thick double-sided tape to obtain a laminate. The amount of transmission attenuation of the obtained laminate upon the measurement using a microstripline was 3.7 dB as measured at 1 GHz, and the amount of transmission attenuation of the obtained laminate upon the measurement using a loop antenna was 10.9 dB as measured at 10 MHz.

The amounts of transmission attenuation of the resulting laminate are shown in Table 2.

TABLE 1

| | Magnetic layer | | | |
|---|---|---|---|---|
| | $Fe_2O_3$ [mol %] | NiO [mol %] | ZnO [mol %] | CuO [mol %] |
| Example 1 | 49.4 | 8.7 | 34.3 | 7.6 |
| Example 2 | 49.4 | 8.7 | 34.3 | 7.6 |
| Example 3 | 47.6 | 11.1 | 29.5 | 11.8 |
| Example 4 | 48.9 | 15.3 | 24.7 | 11.1 |
| Comparative Example 1 | 48.6 | 14.2 | 26.3 | 10.9 |

| | Magnetic layer | | | | |
|---|---|---|---|---|---|
| | Sintering Temp. [° C.] | Density [g/cm³] | Thickness [μm] | Real part μ' 10 MHz | Imaginary part μ" 10 MHz |
| Example 1 | 880 | 4.83 | 26 | 170 | 128 |
| Example 2 | 975 | 5.28 | 102 | 455 | 411 |
| Example 3 | 925 | 5.18 | 60 | 288 | 187 |
| Example 4 | 890 | 5.02 | 45 | 158 | 37 |
| Comparative | 940 | 5.20 | 84 | 305 | 113 |

TABLE 1-continued

Example 1

| | Conductive layer | | | |
|---|---|---|---|---|
| | Carbon [wt %] | Acrylic resin [wt %] | Phenol resin [wt %] | Flame retardant Aluminum hydroxide [wt %] |
| Example 1 | 8 | 12 | 2 | 14 |
| Example 2 | 13 | 20 | 6 | 25 |
| Example 3 | 24 | 15 | 7 | 13 |
| Example 4 | 14 | 15 | 5 | 17 |
| Comparative Example 1 | No conductive layer laminated | | | |

| | Conductive layer | | | | |
|---|---|---|---|---|---|
| | Dispersing agent | | | | Surface |
| | Magnetite [wt %] | Hematite [wt %] | Silicon oxide [wt %] | Thickness [μm] | electrical resistance [Ω/□] |
| Example 1 | 64 | 0 | 0 | 20 | 4860 |
| Example 2 | 36 | 0 | 0 | 85 | 786 |
| Example 3 | 0 | 41 | 0 | 60 | 115 |
| Example 4 | 25 | 0 | 24 | 45 | 500 |
| Comparative Example 1 | No conductive layer laminated | | | | |

TABLE 2

| | Amount of transmission attenuation | |
|---|---|---|
| | Measurement using loop antenna at 10 MHz [dB] | Measurement using microstripline at 1 GHz [dB] |
| Example 1 | 19.9 | 3.8 |
| Example 2 | 27.4 | 5.4 |
| Example 3 | 22.7 | 7.3 |
| Example 4 | 14.8 | 4.8 |
| Comparative Example 1 | 21.3 | 1.0 |
| Comparative Example 2 | 10.8 | 1.2 |
| Comparative Example 3 | 10.9 | 3.7 |

The invention claimed is:

1. A ferrite laminate comprising:
a conductive layer comprising a conductive filler and a resin, and
a magnetic layer comprising a sintered ferrite, wherein
the conductive layer has a surface electrical resistance of 100 to 5000 Ω/□,
the conductive layer has a thickness of 15 to 90 μm, and the magnetic layer does not comprise a resin,
wherein a real part of a magnetic permeability of the magnetic layer as measured at 10 MHz is 130 to 480, and an imaginary part of the magnetic permeability of the magnetic layer as measured at 10 MHz is 30 to 440, and
wherein the sintered ferrite has a composition comprising 47 to 50 mol % of $Fe_2O_3$, 8 to 16 mol % of NiO, 24 to 35 mol % of ZnO and 7 to 12.5 mol % of CuO, as calculated in terms of the respective oxides, with the proviso that a total molar amount of these oxides is 100 mol %.

2. The ferrite laminate according to claim 1, wherein when subjecting the ferrite laminate to measurement of transmission attenuation using a microstripline, an amount of transmission attenuation of the ferrite laminate is 3.6 to 8 dB as measured at 1 GHz, and when subjecting the ferrite laminate to measurement of transmission attenuation using a loop antenna, an amount of transmission attenuation of the ferrite laminate is 12 to 30 dB as measured at 10 MHz.

3. The ferrite laminate according to claim 1, wherein the conductive layer and the magnetic layer are laminated together through an adhesive layer.

4. The ferrite laminate according to claim 1, wherein the ferrite laminate further comprises an adhesive layer or a protective layer on at least one surface thereof.

5. The ferrite laminate according to claim 1, wherein the ferrite laminate further comprises an adhesive layer on one surface thereof, and the ferrite laminate further comprises a protective layer on the other surface thereof.

6. A noise suppression sheet comprising the ferrite laminate according to claim 1.

* * * * *